(12) United States Patent
Lee

(10) Patent No.: US 6,248,622 B1
(45) Date of Patent: Jun. 19, 2001

(54) FABRICATION METHOD FOR ULTRA SHORT CHANNEL DEVICE COMPRISING SELF-ALIGNED LANDING PAD

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/427,880

(22) Filed: Oct. 27, 1999

(30) Foreign Application Priority Data

Oct. 4, 1999 (TW) .................................................. 88117042

(51) Int. Cl.⁷ .................................................. H01L 21/8242
(52) U.S. Cl. .................... 438/239; 438/300; 438/595; 438/421; 438/619
(58) Field of Search .................................................. 438/239, 248, 438/257, 259, 262, 266, 241, 392, 364, 692, 697, 734, 300, 595, 421–422, 619

(56) References Cited

U.S. PATENT DOCUMENTS 6,022,776 * 2/2000 Lien et al. .............................. 438/253

* cited by examiner

*Primary Examiner*—Charles Bowers
*Assistant Examiner*—Yennhu B. Huynh
(74) *Attorney, Agent, or Firm*—Charles C. H. Wu & Associates; Charles C. H. Wu

(57) ABSTRACT

A fabrication method for an ultra short channel device comprising a self-aligned landing pad is described in which a first opening is formed in the oxide layer to define a gate structure region. A pad oxide layer is then formed in the first opening covering the substrate followed by forming a spacer on the inner sidewall of the first opening. Using the spacer as an etching mask, a portion of the oxide layer is removed to form a second opening exposing the substrate. A gate oxide layer is then deposited in the second opening, followed by forming a first conductive layer to fill the second opening. A third opening is then formed in the oxide layer to expose the substrate and to define the source/drain region. An ion implantation is then conducted in the substrate of the third opening to form a heavily doped region of the source/drain region. Thereafter, a landing pad is formed to fill the third opening and to electrically connect with the source/drain region. The spacer is then removed to form a fourth opening in the exposed pad oxide layer. An ion implantation is then conducted in the substrate of the fourth opening to form the lightly doped region.

31 Claims, 4 Drawing Sheets

FABRICATION METHOD FOR ULTRA SHORT CHANNEL DEVICE COMPRISING SELF-ALIGNED LANDING PAD

BACKGROUND OF THE INVENTION

1. Field of the Invention

The present invention relates to a fabrication method for a semiconductor device. More particularly, the present invention relates to a fabrication method for an ultra short channel device having a self-aligned landing pad.

2. Description of the Related Art

As the design rule of a semiconductor device is gradually reduced, the control of the critical dimension in a photolithography process, however, is hindered by the limitations of the light resolution and the depth of focus (DOF). This hindrance seriously affects the pursuit of a reduced memory cell area. Even when using an improved technique, such as the phase shift mask (PSM), the photoresist is still unable to provide a reproducible definition.

The conventional approach to reducing the critical dimension usually requires employment of a more complicated mask, for example, a phase shifting mask (PSM), and to conduct a special exposure technique, for example, an off-axial illumination. The purpose of reducing the critical dimension is achieved with the above approach; the manufacturing cost of an integrated circuit, however, is also increases significantly.

Although photolithography is one of the major techniques leading the development of a semiconductor device, it is also a major contribution to the manufacturing cost of the semiconductor. It is therefore desirable to employ less technically demanding photolithography techniques to form a small channel length and a device with a smaller dimension. Both the cost of production and the technical demands can be lowered while the operating speed of the device is improved.

Furthermore, due to the increase of the integration of a dynamic random access memory (DRAM) device, the dimensions of the memory cell and the area occupied by the DRAM capacitor are being reduced. Lowering the device dimension, however, would lower the capacitance. For a highly integrated DRAM device, a three dimensional capacitor is needed to maintain its capacitance at an acceptable value. As a result, a stacked capacitor, a trench-stacked capacitor or a crown-shaped capacitor is used to provide a large capacitor area and to lower the interference between the DRAM memory cells. As the complexity of the capacitor structure continues to increase, the height of the capacitor also increases. A capacitance-over-bit line is therefore normally used for the design of a storage node to avoid the limitation of space in the design of a capacitor.

FIGS. 1A to 1C are schematic, cross-sectional views showing the manufacturing of a semiconductor device according to the prior art.

Referring to FIG. 1A, according to the conventional fabrication method of a semiconductor device, a shallow trench isolation structure 102 is formed in the substrate 100 to define the active region. A gate oxide layer 104 and a polysilicon layer 106 are then sequentially formed on the substrate 100.

Referring to FIG. 1B, the polysilicon layer 106 and the gate oxide layer 104 are defined to form a gate structure 108, in which the gate structure 108 is formed with the polysilicon layer 106a and the gate oxide layer 104a. Using the gate structure 108 as a mask, an ion implantation is conducted to form a lightly doped source/drain region 110 in the substrate 100 at both sides of the gate structure 108. A spacer 112 is then formed on the sidewall of the gate structure 108. Further using the gate structure 108 and the spacer 112 as masks, an ion implantation is conducted to form a heavily doped region 114. Thereafter, a dielectric layer 116 is formed to cover the substrate 100.

Continuing to FIG. 1C, a portion of the dielectric layer 116 is removed to form a contact window 118, exposing a portion of the source/drain region 114. Subsequently, a bit-line and a bottom electrode structure of a dynamic memory cell device are formed.

In the above approach, misalignment often occurs during the formation of the contact window in the dielectric layer. As a result, the formation of the contact window requires a smaller design rule to avoid the unexpected electrical connection resulting from the misalignment.

Furthermore, during the formation of the contact window, it is necessary to etch a substantial thickness of the dielectric layer to expose the source/drain region, which further increases the technical difficulty of the manufacturing process. The aspect ratio of the node contact window formed according to the conventional approach is also very high; the formation of the storage node contact electrode in the node contact window therefore becomes very difficult. The storage node contact electrode formed may have voids or the problem of an increased resistance between the storage node contact electrode and the drain region may arise.

SUMMARY OF THE INVENTION

Based on the foregoing, the present embodiment of the invention provides a fabrication method for an ultra short channel of a device which comprises a self-aligned landing pad. The method is applicable to the manufacturing of a dynamic random access memory device in which an oxide layer is formed on a substrate comprising device isolation structures. A first opening is then formed in the oxide layer to define the gate structure region. Thereafter, a pad oxide layer is formed in the opening covering the substrate followed by forming a spacer on the sidewall of the first opening. Using the spacer as an etching mask, a portion of the pad oxide layer is removed to form a second opening exposing the substrate. A gate oxide layer is then deposited in the second opening. A conductive layer serving as a gate is then formed, filling the second opening. After this, the oxide layer is defined to form a third opening exposing the substrate and defining the territory for the source/drain region. An ion implantation is then conducted on the substrate of the third opening to form a heavily doped region of the source/drain region. A landing pad is subsequently formed to fill the third opening, wherein the landing pad is served as an elevated source/drain region and is electrically connected to the heavily doped region. The spacer is then removed to form a fourth opening, exposing the pad oxide layer. After this, an ion implantation is conducted on the substrate of the fourth opening to form a lightly doped source/drain region in the substrate. A nitridation process is further conducted to form a protective layer on the conductive layer. A defined dielectric layer is further deposited on the substrate with contact windows, which dielectric layer exposes a portion of the landing pad, wherein the contact windows include a bit line contact window and a node contact window. Subsequently, a bit line and a bottom electrode structure, which are electrically connected to the landing pad, are formed in the contact window.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2H are schematic, cross-sectional views showing the manufacturing of an ultra short channel device which comprises a self-aligned landing pad according to the present invention. In the present preferred embodiment, the fabrication of a dynamic random access memory cell of an integrated circuit is used as an example.

Figure 1A:
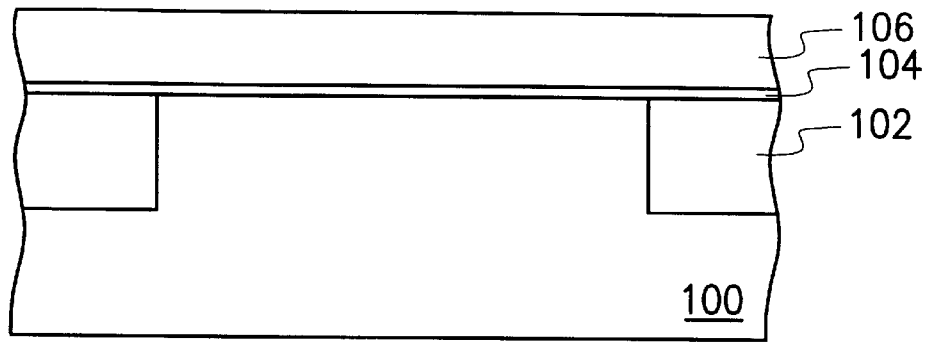
FIGS. 1A to 1C are schematic, cross-sectional views showing the manufacturing of a semiconductor device according to the prior art.
Figure 1B:
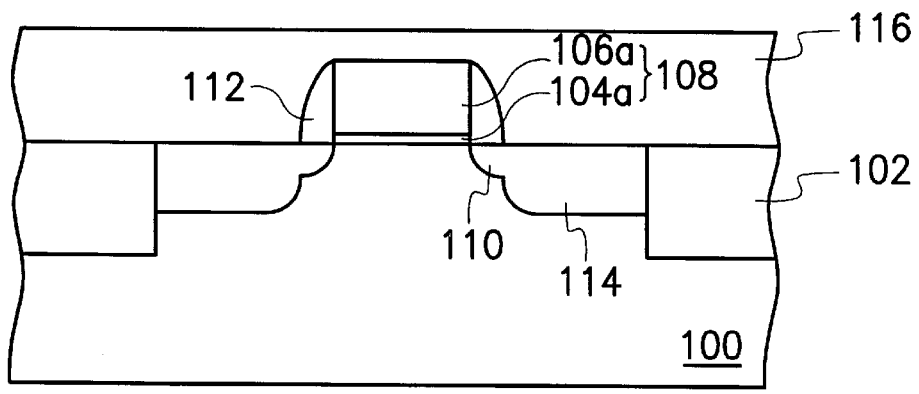
Figure 1C:
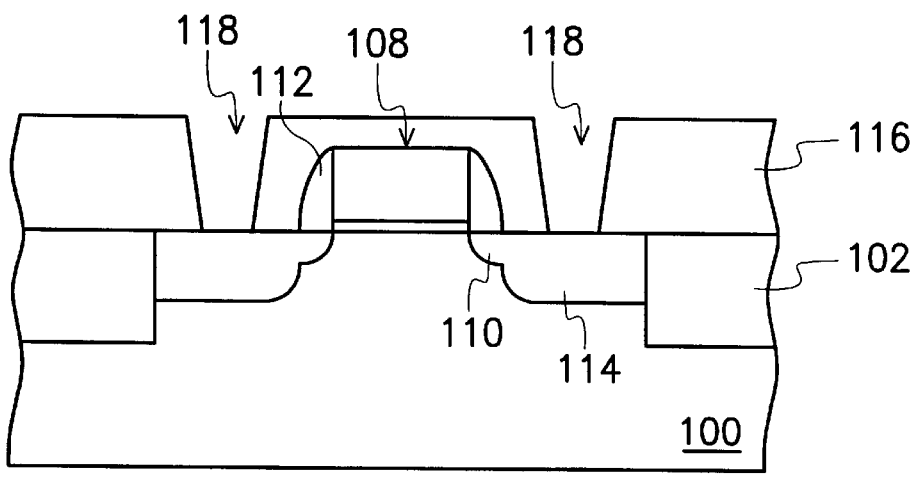
Figure 2A:
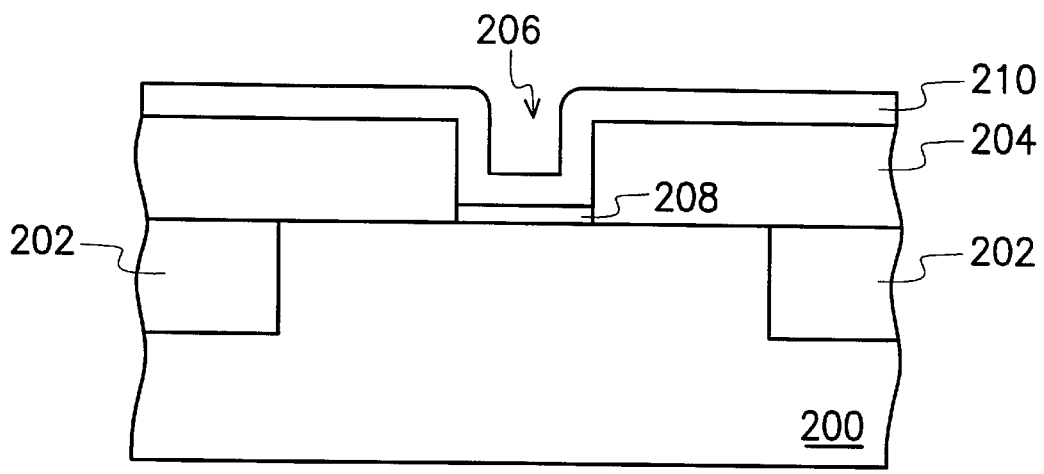
FIGS. 2A to 2H are schematic, cross-sectional views showing the manufacturing of an ultra-short channel device which comprises a self-aligned landing pad according to the preferred embodiment of the present invention.

Referring to FIG. 2A, device isolation structures 202 are formed in a substrate 200, for example, a P-type substrate, to define the active region. An oxide layer 204 is then formed on the substrate 200, followed by forming an opening 206 in the oxide layer 204 to define the gate structure region. A pad oxide layer 208 is further formed on the substrate 200 of the opening 206, followed by forming a conformal silicon nitride layer 210 on the oxide layer 204 and the pad oxide layer 208.

Figure 2B:
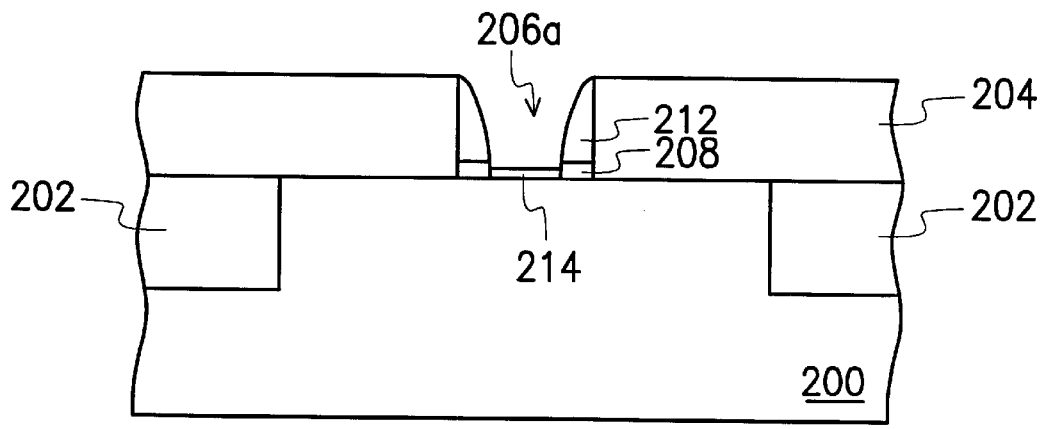

Referring to FIG. 2B, an etching back is then conducted to remove a portion of the silicon nitride layer 210 to form a spacer 212 on the sidewall of the opening 206. Using the spacer 212 as an etching mask, a portion of the pad oxide layer 208 is removed to form the opening 206a that exposes the substrate 200. A gate oxide layer 214 is then formed on the substrate in the opening 206a. The gate oxide layer 214 is formed by thermal oxidation, and the thickness of the gate oxide layer 214 depends on the requirements of the subsequent processes.

Figure 2C:
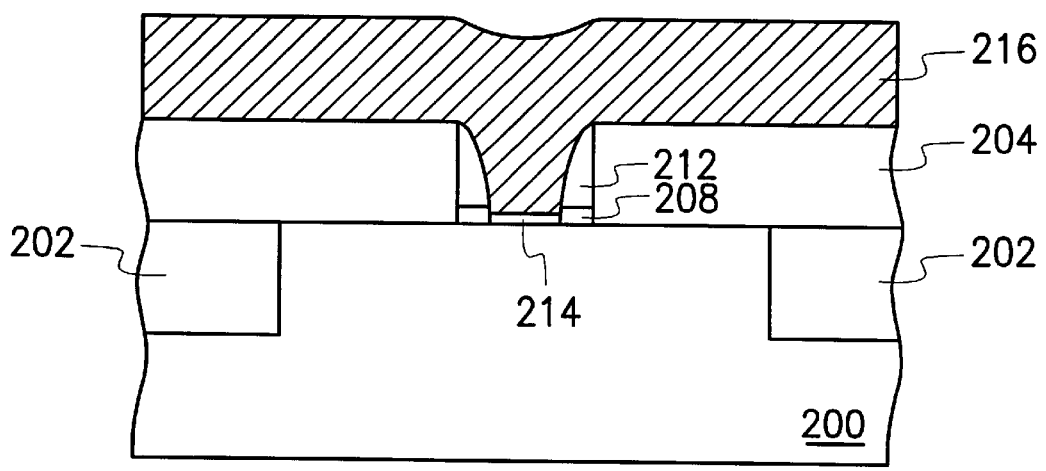

Referring to FIG. 2C, a conductive layer 216 is then formed covering the substrate 200 and filling the opening 206a. The conductive layer 216, such as a polysilicon layer, is formed by, for example, chemical vapor deposition (CVD).

Figure 2D:
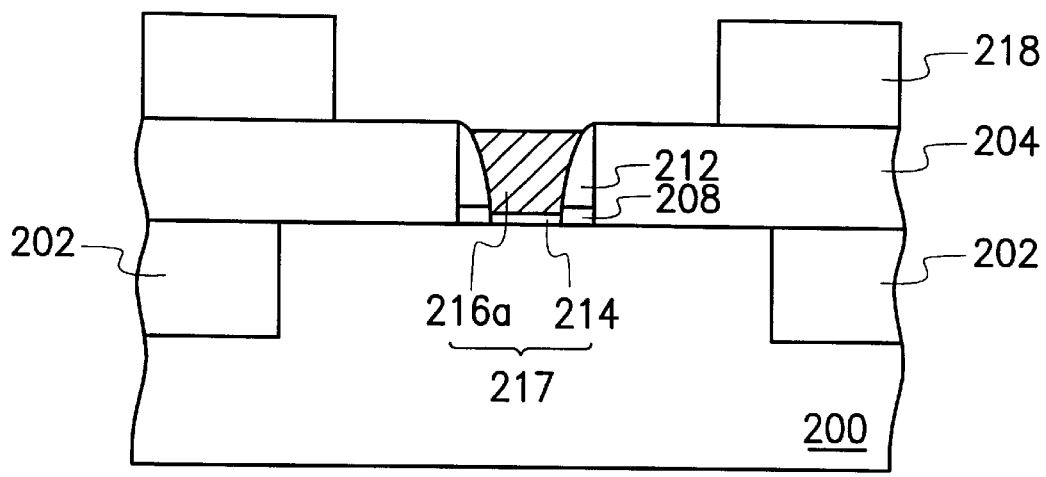

Continuing to FIG. 2D, back etching or chemical mechanical polishing (CMP) is then conducted to remove a portion of the conductive layer 216 to form a conductive layer 216a at a height which is substantially the same as that of the surface of the oxide layer 204. The conductive layer 216a and the gate oxide layer 214 together form the gate structure 217. A patterned photoresist 218 is then formed on the oxide layer 204 to define the desired territory for the subsequently formed source/drain region.

Figure 2E:
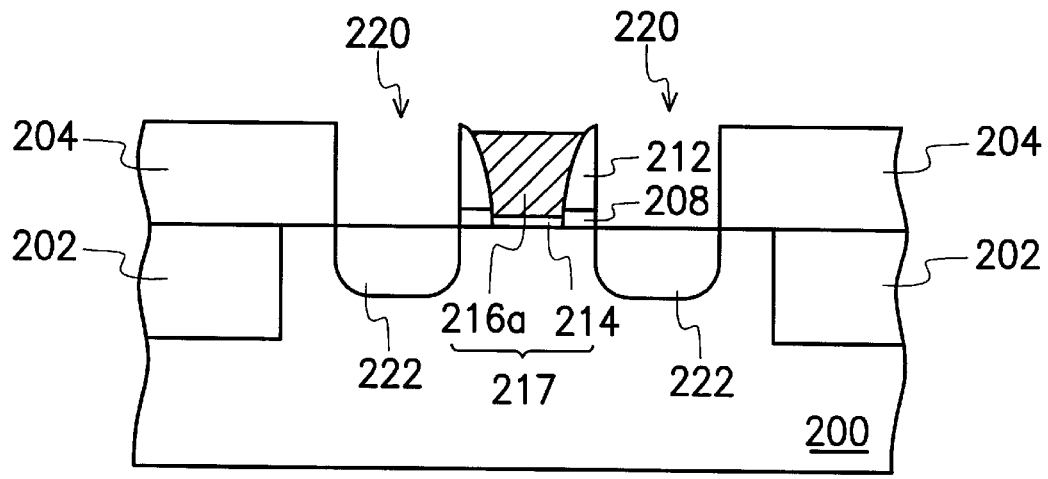

As shown in FIG. 2E, using the patterned photoresist 218 as an etching mask, a portion of the oxide layer 204 is removed to form an opening 220 in the oxide layer 204, exposing the substrate 200. The oxide layer 204 is partially removed by, for example, anisotropic etching.

Since the etching selectivity ratio of the oxide layer 204 to the silicon nitride spacer 212 or to the conductive layer 216a is high enough, the silicon nitride spacer 212 and the conductive layer 216a are prevented from being damaged while the oxide layer 204 is being removed. As a result, the fabrication window for the photolithography and etching processes is wider and the manufacturing processing is simpler. Taking advantage of the etching selectivity ratios of the oxide layer 204 to the silicon nitride spacer 212 and to the conductive layer 216a, the opening 220 is formed to expose the territory of the source/drain region.

After this, the photoresist layer 218 is removed, followed by conducting an ion implantation process to form a heavily doped region 222 in the exposed substrate 200 of the opening 220. The heavily doped region 222 serves as the source/drain region. The implanted ion is, for example, an N-type dopant at a concentration of about 1E15 to about 1E16 ions/cm$^3$.

Figure 2F:
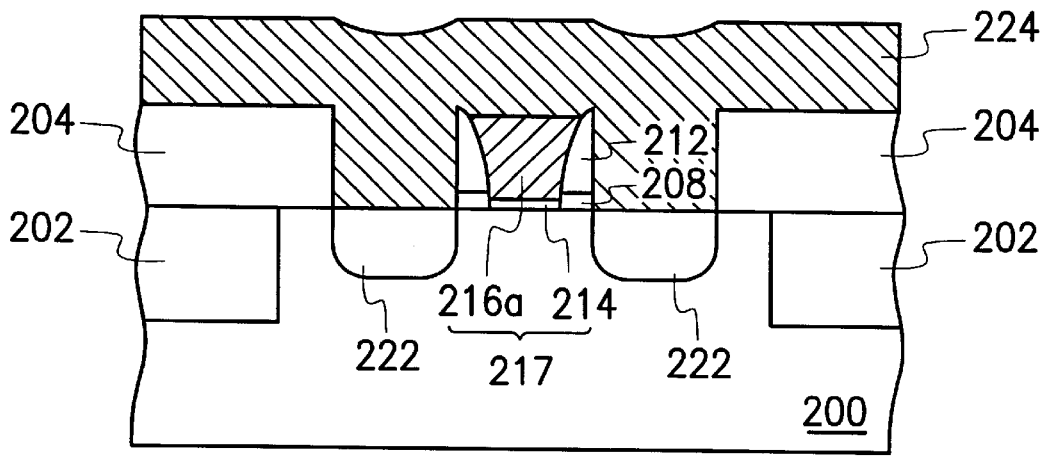

Referring to FIG. 2F, a conductive layer 224, for example, a polysilicon or a tungsten layer, is formed, covering the substrate 200 and filling the opening 220.

Figure 2G:
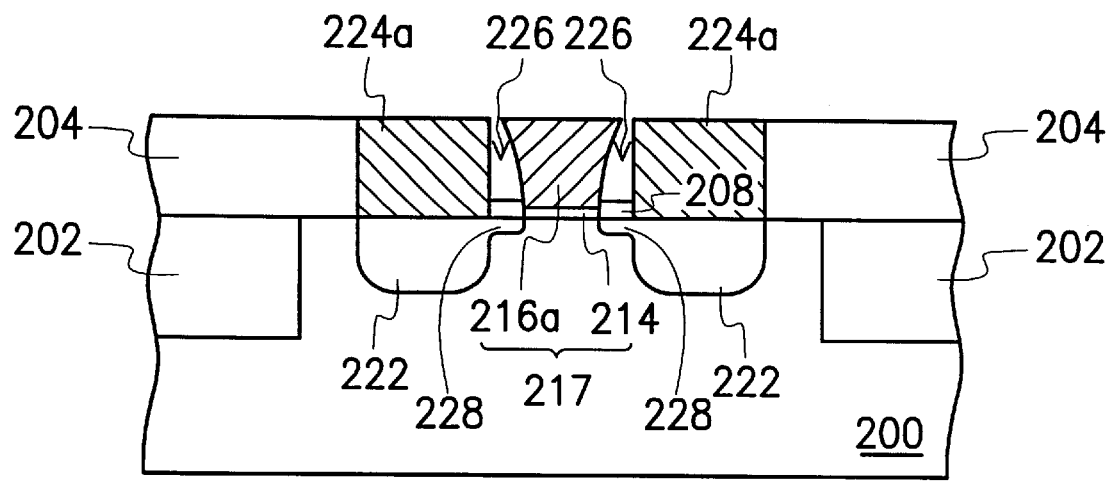

Continuing to FIG. 2G, back etching or chemical mechanical polishing is conducted to remove a portion of the conductive layer 224 (as in FIG. 2F) to form a conductive layer 224a at a height which is substantially the same as that of the surface of the oxide layer 204. The conductive layer 224a is the landing pad formed by a self-aligned approach to serve as an elevated source/drain region. The spacer 212 is then removed to form an opening 226, which exposes the pad oxide layer 208. An ion implantation is further conducted in the substrate 200 of the opening 226 to form the lightly doped source/drain region 228 in the substrate 200. The ion implanted in this ion implantation process is for example, an N-type dopant at a concentration of about 1E12 to about 1E14 ions/cm$^3$.

Since the spacer 212 is formed on the inner sidewall of the opening 206 (as in FIG. 2B), after the removal of the spacer, the channel length between the lightly doped source/drain region 228 is reduced. According to the embodiment of the present invention, the spacer is formed on the inner sidewall of the opening, and a less technically demanding photolithography techniques can be used to form an ultra short channel, which implies that a smaller-dimensioned device is obtained. As a result, the technical demands and the operating cost are lower while the device operating speed is improved.

Figure 2H:
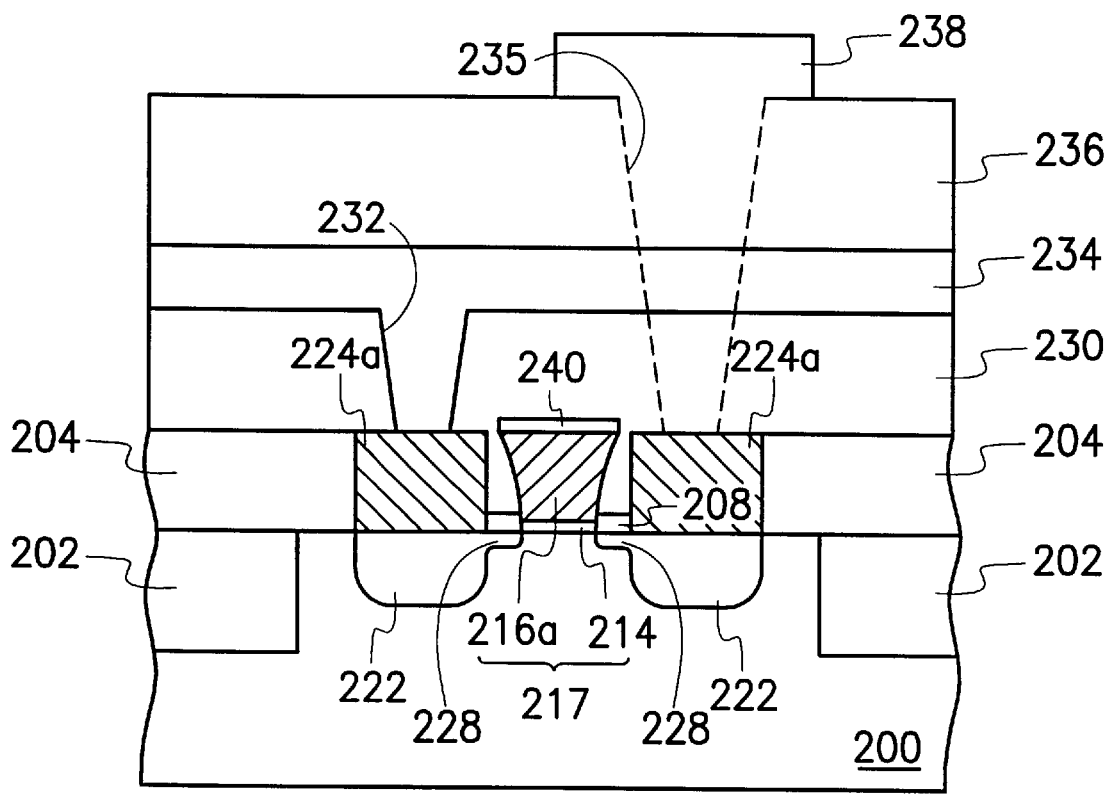

Referring to FIG. 2H, a nitridation process is conducted to form a protective layer 240 on the conductive layer 216a of the gate structure 217 if the conductive layer 216a is polysilicon and the landing pad 224a is tungsten, wherein the protective layer 240 is, for example, silicon nitride. A dielectric layer 230, for example, a low dielectric constant dielectric material, is then formed on the substrate 200. The dielectric layer 230 is defined to form a contact window 232 exposing a portion of the landing pad 224a, wherein the contact window 232 can be a bit line contact window and/or a node storage contact window.

As the line width in a semiconductor manufacturing continues to reduce and the integration continues to increase, misalignment easily occurs during the formation of a contact window. Consequently, the gate may be damaged and abnormal electrical connection may occur between the subsequently formed bit line and the bottom electrode structure of the capacitor, leading to an ineffective device.

The embodiment of the present invention, on the other hand, employs a nitridation process to form a protective layer 240 on the conductive layer 216a of the gate structure 217 to prevent the consequences of a potential misalignment during the formation of the contact window 232. The problems of possible damages to the gate and an abnormal connection between the subsequently formed bit line and bottom electrode are avoided.

The etching of a substantially thick dielectric layer during the formation of the contact window also increases the manufacturing difficulties. The present invention, in addition, provides a manufacturing process with lower technical demands, which is applicable to the manufacturing of a dynamic random access memory device with a more flexible design rule. A self-aligned landing pad is used as an elevated source/drain region to lower the aspect ratio of the contact window. The formation of a high aspect ratio, as often results from the conventional practice, is avoided. The great difficulties in forming the storage node contact electrode in the contact window are thus reduced. The problems of possible void formation in the node storage contact electrode or an increase of the resistance between the node contact electrode and the drain region are also prevented.

If the bit line contact window and the storage node contact window are concurrently formed, followed by filling the bit line contact window and the storage node contact window with the defined conductive layer to form the bit line and the storage node. In the present embodiment, the bit line contact window and the storage node contact window are formed separately.

A bit line contact window 232 is formed in the first dielectric layer 230. A defined conductive layer is then deposited, covering the first dielectric layer 230 and filling the bit line contact window, to form the bit line 234 of the dynamic random access memory device. A second dielectric layer 236, for example, a low dielectric constant dielectric layer, is then formed on the bit line 234. The second dielectric layer 236 and the first dielectric layer 230 are then defined to form the storage node contact window 235. Consequently, a defined conductive layer is formed, covering the second dielectric layer 236 and filling the storage node contact window 235 to form a bottom electrode structure 238 of the dynamic random access memory device capacitor. The bit line 234 is connected to the landing pad 224a, and through the landing pad 224a, the bit line 234 is electrically connected with the source region. On the other hand, the bottom electrode structure 238, which is also connected to the landing pad 224a, is electrically connect with the drain region through the landing pad 224a. The subsequent manufacturing processes are familiar to those who are skilled in the art and will not be reiterated in the present preferred embodiment.

The fabrication method for a short channel device having a self-aligned landing pad according to the present invention comprises at least the following characteristics. The formation of the landing pad to serve as an elevated source/drain region according to the present invention effectively reduces the aspect ratio of the contact window, which facilitates the subsequent processes and increases the quality of the product. The present invention thus reduces the technical difficulty of the processing and provides more flexibility to the design rule. The present invention further provides a metal oxide semiconductor device with ultra short channel length by defining the channel length with a spacer formed on the inner sidewall of the gate. The reduced channel length improves the operating speed of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication process for a dynamic random access memory device, the method comprising the steps of:
providing a substrate comprising a device isolation structure;
forming an oxide layer on the substrate, wherein the oxide layer comprises a first opening which exposes a first part of the substrate;
forming a pad oxide layer on the first exposed part of the substrate;
forming a spacer on a sidewall of the first opening;
etching a portion of the pad oxide layer to expose a second part of the substrate;
forming a gate oxide layer on the second exposed part of the substrate;
filling the first opening with a first conductive layer, wherein a surface of the first opening is substantially as high as a surface of the oxide layer;
forming a second opening in the oxide layer on both sides of the conductive layer to expose a third part of the substrate;
forming a heavily doped region of a source/drain region in the third exposed part of the substrate;
filling the second opening with a second conductive layer, wherein a surface of the second opening is substantially as high as the surface of the oxide layer;
removing the spacer to expose the pad oxide layer;
forming a lightly doped region in the substrate under the exposed pad oxide layer;
forming a protective layer on the conductive layer; and
forming a bit line structure and a bottom electrode on the substrate.

2. The fabrication method for a dynamic random access memory device according to claim 1, wherein the spacer serves as a mask when etching the portion of the pad oxide layer.

3. The fabrication process for a dynamic random access memory device according to claim 1, wherein the first conductive layer serves as a portion of a gate.

4. The fabrication process for a dynamic random access memory device according to claim 1, wherein the second conductive layer serves as a landing pad.

5. The fabrication process for a dynamic random access memory device according to claim 1, wherein the formation of the first conductive layer includes:
forming a conductive layer to cover the substrate and to fill the first opening; and
planarizing the conductive layer to the surface of the oxide layer.

6. The fabrication process for a dynamic random access memory device according to claim 1, wherein the formation of the second conductive layer includes:
forming a conductive layer to cover the substrate and to fill the second opening; and
planarizing the conductive layer to the surface of the oxide layer.

7. The fabrication process for a dynamic random access memory device according to claim 1, wherein the second conductive layer is polysilicon.

8. The fabrication process for a dynamic random access memory device according to claim 1, wherein the second conductive layer is tungsten.

9. The fabrication process for a dynamic random access memory device according to claim 1, wherein the step of forming the heavily doped region includes conducting an ion implantation.

10. The fabrication process for a dynamic random access memory device according to claim 1, wherein the step of forming the lightly doped region includes conducting an ion implantation.

11. The fabrication process for a dynamic random access memory device according to claim 1, wherein the protective layer includes silicon nitride.

12. The fabrication process for a dynamic random access memory cell according to claim 1, wherein the step of forming the protective layer on the conductive layer includes conducting a nitridation process.

13. The fabrication process for a dynamic random access memory device according to claim 1, wherein the step of forming the bit line structure and the bottom electrode includes:

forming a dielectric layer comprising a bit line contact window and a node contact window on the substrate, wherein the bit line contact window and the node contact window expose a portion of the second conductive layer; and forming a bit line structure in the bit line contact window and a bottom electrode structure in the node contact window.

14. The fabrication method for a dynamic random access memory device according to claim 13, wherein the dielectric layer includes a low dielectric constant dielectric material.

15. The fabrication method for a dynamic random access memory device according to claim 13, wherein the contact window includes a storage node contact window.

16. The fabrication method for a dynamic random access memory device according to claim 13, wherein the first conductive layer and the second conductive layer are not connected.

17. The fabrication process for a dynamic random access memory device according to claim 1, wherein the step of forming the bit line structure and the bottom electrode includes:

forming a first dielectric layer comprising a bit line contact window on the substrate, wherein the bit line contact window exposes the portion of the second conductive layer;

forming a bit line structure to connect with the second conductive layer, wherein the bit line structure is electrically connected to the source region through the second conductive layer;

forming a second dielectric layer comprising a node contact window on the substrate, wherein the node contact window exposes a portion of the second conductive layer; and forming a bottom electrode to connect with the second conductive layer, wherein the bottom electrode is electrically connected to the drain region through the second conductive layer.

18. The fabrication method for a dynamic random access memory device according to claim 17, wherein the step of forming the bit line structure includes forming a patterned third conductive layer to cover the first dielectric layer and to fill the bit line contact window.

19. The fabrication method for a dynamic random access memory device according to claim 17, wherein the step of forming the bottom electrode structure includes forming a fourth patterned conductive layer to cover the second dielectric layer and to fill the node contact window.

20. The fabrication method for a dynamic random access memory device according to claim 17, wherein the dielectric layer includes a low dielectric constant dielectric material.

21. The fabrication method for a dynamic random access memory device according to claim 17, wherein the contact window includes a storage node contact window.

22. The fabrication method for a dynamic random access memory device according to claim 17, wherein the first conductive layer and the second conductive layer are not connected.

23. A fabrication method for an ultra short channel device comprising a self-aligned landing pad, the method comprising the steps of:

providing a substrate comprising a device isolation structure;

forming an oxide layer comprising a first opening on the substrate, wherein the first opening exposes a first part of the substrate;

forming a spacer on a sidewall of the first opening to form a second opening, wherein the second opening is smaller than the first opening;

forming a gate in the second opening, wherein a surface of the gate is substantially as high as a surface of the oxide layer;

forming a third opening in the oxide layer on both sides of the gate to expose a second part of the substrate;

forming a heavily doped region of a source/drain region in the second exposed part of the substrate;

forming a landing pad in the third opening, wherein a surface of the landing pad is substantially as high as the surface of the oxide layer;

removing the spacer; and forming a lightly doped region in the substrate previously occupied by the spacer.

24. The fabrication method for an ultra short channel device comprising a self-aligned landing pad according to claim 23, wherein the step of forming the landing pad includes:

forming a second conductive layer to cover the substrate and to fill the third opening; and planarizing the second conductive layer to the surface of the oxide layer.

25. The fabrication method for an ultra short channel device comprising a self-aligned landing pad according to claim 23, wherein the landing pad includes polysilicon.

26. The fabrication method for an ultra short channel device comprising a self-aligned landing pad according to claim 23, wherein the landing pad includes tungsten.

27. The fabrication method for an ultra short channel device comprising a self-aligned landing pad according to claim 23, wherein the step of forming the gate includes:

forming a gate oxide layer in the second opening;

forming a first conductive layer to cover the substrate and to fill the second opening; and planarizing the first conductive layer to the surface of the oxide layer.

28. A fabrication method for a semiconductor device comprising an elevated source/drain region, the method comprising the steps of:

forming a substrate comprising a device isolation structure;

forming an oxide layer with a first opening on the substrate, wherein the first opening exposes a first part of the substrate;

forming a gate in the first opening, wherein a surface of the gate is substantially as high as a surface of the oxide layer;

forming a second opening in the oxide layer on both sides of the gate to expose a second part of the substrate;

forming a heavily doped region of the source/drain region in the exposed second part of the substrate; and forming a landing pad in the second opening, wherein a surface of the landing pad is substantially as high as the surface of the oxide layer.

29. The fabrication of a semiconductor device comprising an elevated source/drain region according to claim 28, wherein the landing pad includes polysilicon.

30. The fabrication of a semiconductor device comprising an elevated source/drain region according to claim 28, wherein the landing pad includes tungsten.

31. The fabrication of a semiconductor device comprising an elevated source/drain region according to claim 28, wherein the step of forming the landing pad includes:

forming a conductive layer to cover the substrate and to fill the second opening; and planarizing the conductive layer to the surface of the oxide layer.

* * * * *